(12) United States Patent
Chen et al.

(10) Patent No.: US 7,486,118 B2
(45) Date of Patent: Feb. 3, 2009

(54) SIGNAL GENERATING APPARATUS AND METHOD THEREOF

(75) Inventors: Hsin-Hung Chen, Miaoli County (TW); Tai-Yuan Yu, Taoyuan County (TW); Ling-Wei Ke, Hsin-Chu Hsien (TW); Tser-Yu Lin, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 13 days.

(21) Appl. No.: 11/690,144

(22) Filed: Mar. 23, 2007

(65) Prior Publication Data
US 2008/0272811 A1    Nov. 6, 2008

(51) Int. Cl.
*H03L 7/06* (2006.01)
(52) U.S. Cl. .................. 327/156; 327/147; 375/376
(58) Field of Classification Search .......... 327/156, 327/147; 375/376
See application file for complete search history.

(56) References Cited

U.S. PATENT DOCUMENTS

| 6,724,265 | B2 | 4/2004 | Humphreys |
| 6,806,780 | B2 | 10/2004 | Fontaine et al. |
| 7,068,112 | B2 | 6/2006 | Gotz et al. |
| 7,103,337 | B2 | 9/2006 | Uozumi et al. |
| 2006/0055466 | A1* | 3/2006 | Hirano et al. ............ 331/16 |
| 2006/0245531 | A1* | 11/2006 | Leonowich et al. ........ 375/376 |

* cited by examiner

*Primary Examiner*—Kenneth B Wells
*Assistant Examiner*—Daniel Rojas
(74) *Attorney, Agent, or Firm*—Winston Hsu

(57) ABSTRACT

A signal generating apparatus is disclosed for generating a synthesized signal according to an input signal. The signal generating apparatus includes a phase-locked loop device for generating the synthesized signal; a detecting device for detecting a reference signal to generate a calibrating signal; a filtering device for filtering the input signal and calibrating the input signal according to the calibrating signal to generate a filtered input signal; and a modulating device for modulating the filtered input signal in the normal operation mode and setting the dividing factor according to a first factor setting or a second factor setting in the calibration mode.

19 Claims, 3 Drawing Sheets

SIGNAL GENERATING APPARATUS AND METHOD THEREOF

BACKGROUND

The present invention relates to a signal generating apparatus, and more particularly to a phase-locked loop based transmitter with a closed loop modulation compensation scheme, wherein the modulation compensation scheme calibrates a compensation filter according to an input voltage of a voltage controlled oscillator of the signal generating apparatus, and a method thereof.

Please refer to FIG. 1. FIG. 1 is a related art Sigma-delta fractional N phase locked loop (PLL) transmitter 10. The Sigma-delta fractional N PLL transmitter 10 comprises a phase locked loop circuit 11, a Sigma-delta modulator 12, a channel selector 13, a Transmit filter 14, and a compensation filter 15. The phase locked loop circuit 11 comprises a phase/frequency detector 11a, a charge pump circuit 11b, a loop filter 11c, a voltage-controlled oscillator 11d, and a divider 11e. If the transmitted signal of the Sigma-delta fractional N PLL transmitter 10 is the GMSK signal $S_{GMSK}$, then the Transmit filter 14 is the GMSK filter. Furthermore, as the frequency response of the phase locked loop circuit 11 acts like a low pass filter, the compensation filter 15 is utilized to compensate the baseband data Sb before being modulated by the Sigma-delta modulator 12. The phase locked loop circuit 11 utilizes a reference frequency Sr to synthesize the required frequency to transmit the baseband data Sb. Furthermore, in a multi-band system, the phase locked loop circuit 11 needs to generate different frequency bands, and the channel selector 13 is utilized to select the required frequency band. Accordingly, through the variation of the dividing number of the divider 11e, the phase locked loop circuit 11 can generate different frequency bands accordingly. However, the loop bandwidth of the phase locked loop circuit 11 is sensitive to the variations of parameters in the transfer function of the phase locked loop circuit 11. Therefore, an effective scheme to calibrate the loop bandwidth of the Sigma-delta fractional N phase locked loop (PLL) transmitter 10 is necessary. For the full description of the related techniques, U.S. Pat. Nos. 7,103,337, 7,068,112, 6,724,265, and No. 6,806,780 can be referred to.

SUMMARY

Therefore, one of the objectives of the present invention is to provide a phase-locked loop based transmitter with a closed loop modulation compensation scheme, wherein the modulation compensation scheme calibrates a compensation filter according to an input voltage of a voltage controlled oscillator of the signal generating apparatus, and a method thereof.

According to an embodiment of the present invention, a signal generating apparatus is disclosed. The signal generating apparatus generates a synthesized signal according to an input signal, where the signal generating apparatus comprises a phase-locked loop device, a detecting device, a filtering device, and a modulating device. The phase-locked loop device comprises: a phase detector coupled to a reference oscillating signal for generating a detected signal according to a reference oscillating signal and a feedback signal; a charge pump circuit coupled to the phase detector for generating a control signal according to the detected signal; a filter coupled to the charge pump circuit for filtering the control signal to generate a reference signal; a voltage controlled oscillator coupled to the filter for generating the synthesized signal according to the reference signal; and a divider coupled to the voltage controlled oscillator for dividing the synthesized signal according to a dividing factor for generating the feedback signal. The detecting device is coupled to the filter for detecting the reference signal to generate a calibrating signal. The filtering device is coupled to the detecting device for filtering the input signal and calibrating the input signal according to the calibrating signal to generate a filtered input signal. The modulating device comprises: a modulator coupled to the filtering device and the divider for modulating the filtered input signal in the normal operation mode and setting the dividing factor according to a first factor setting or a second factor setting in the calibration mode; and a first switch coupled to the modulator for selectively inputting the first factor setting or the second factor setting to the modulator.

According to another embodiment of the present invention, a signal generating method disclosed. The signal generating method generates a synthesized signal according to an input signal, where the signal generating method comprises the steps of: utilizing a phase-locked loop device to generate the synthesized signal, wherein the phase-locked loop device comprises a phase detector coupled to a reference oscillating signal for generating a detected signal according to a reference oscillating signal and a feedback signal; a charge pump circuit coupled to the phase detector for generating a control signal according to the detected signal; a filter coupled to the charge pump circuit for filtering the control signal to generate a reference signal; a voltage controlled oscillator coupled to the filter for generating the synthesized signal according to the reference signal; and a divider coupled to the voltage controlled oscillator for dividing the synthesized signal according to a dividing factor for generating the feedback signal; detecting the reference signal to generate a calibrating signal; filtering the input signal and calibrating the input signal according to the calibrating signal to generate a filtered input signal; and modulating the filtered input signal in the normal operation mode and setting the dividing factor according to a first factor setting or a second factor setting in the calibration mode.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
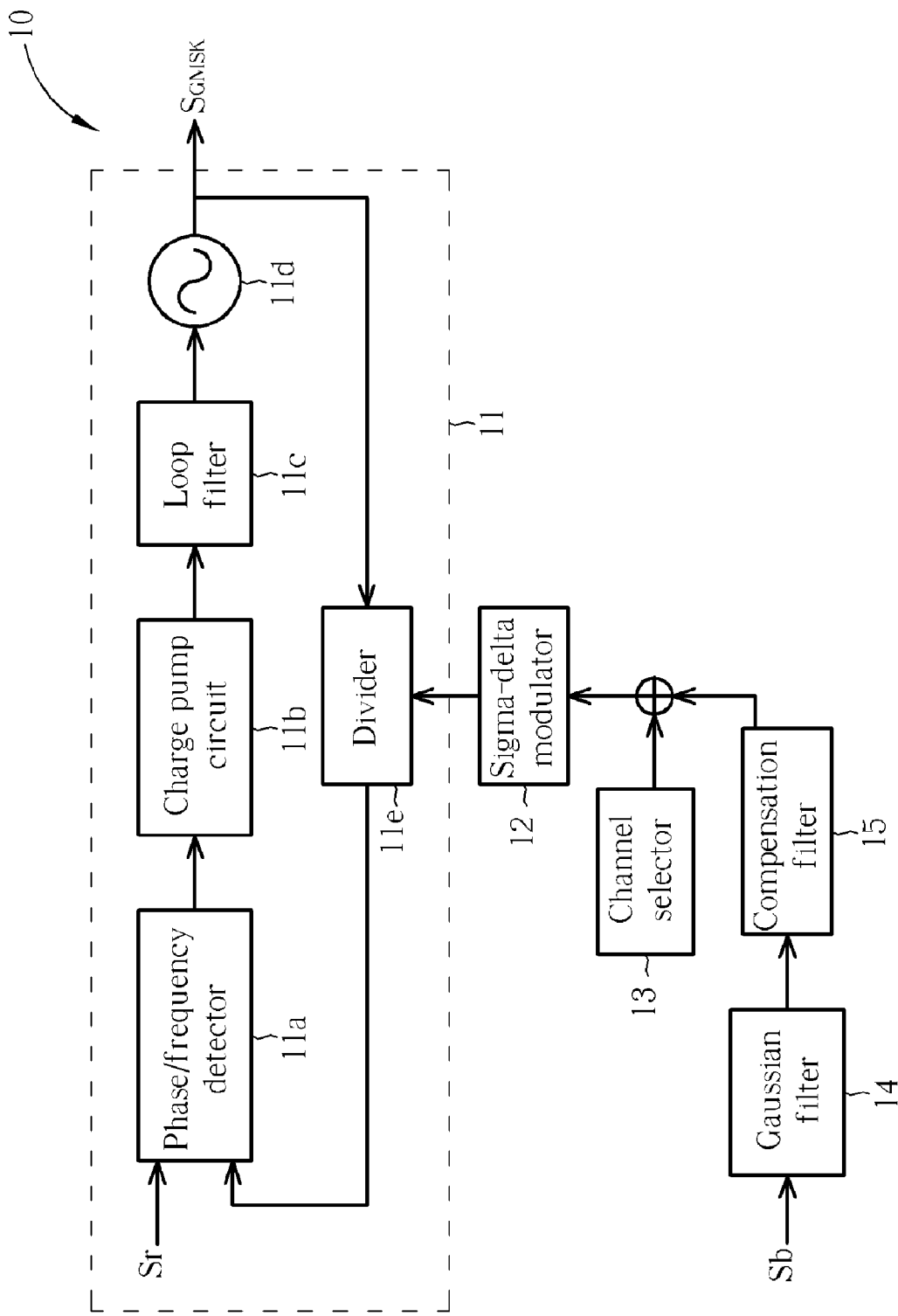
FIG. 1 is a related art Sigma-delta fractional N phase locked loop (PLL) transmitter.
Figure 2:
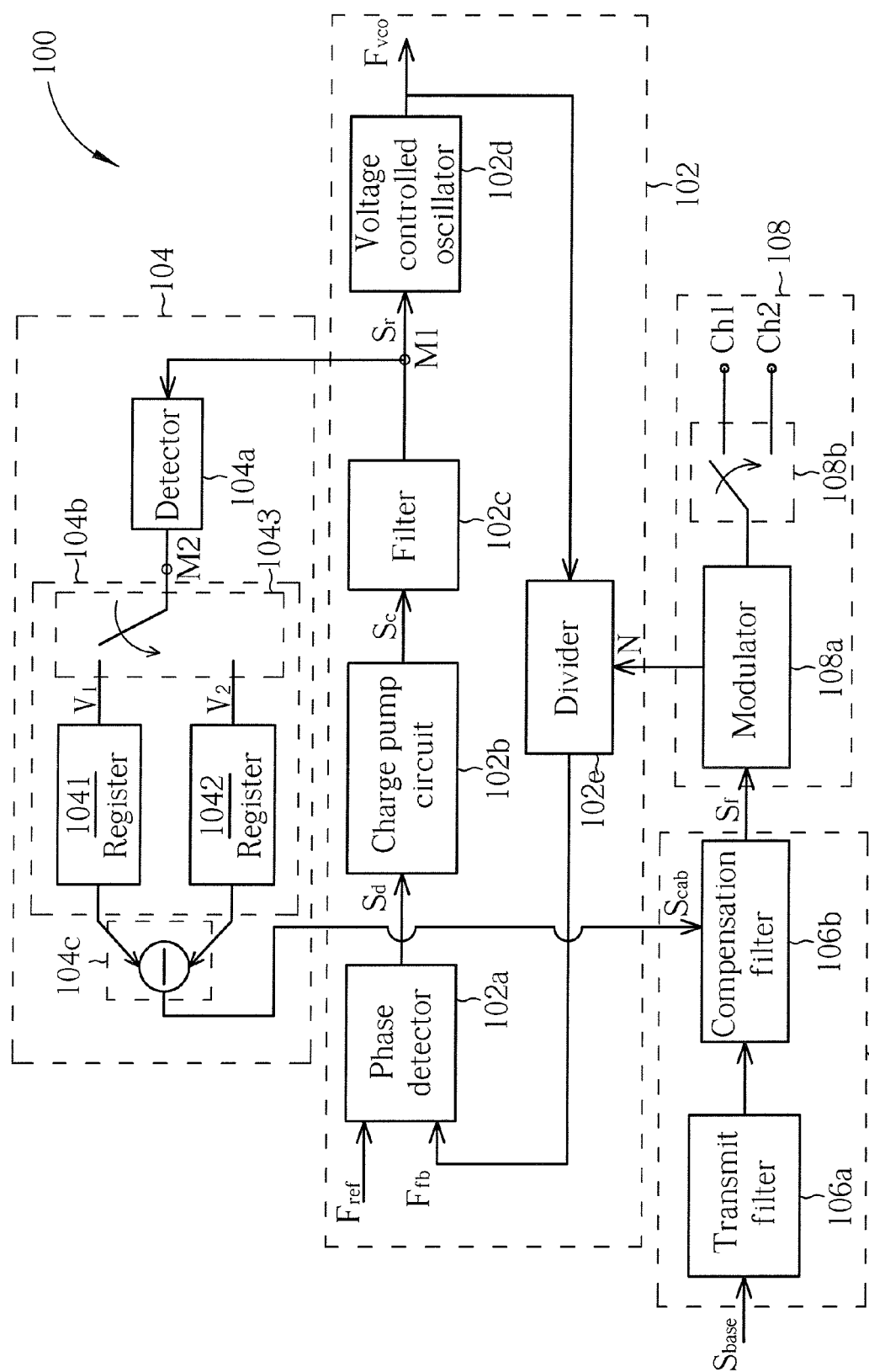
FIG. 2 is a diagram illustrating a signal generating apparatus according to an embodiment of the present invention.

Please refer to FIG. 2. FIG. 2 is a diagram illustrating a signal generating apparatus 100 according to an embodiment of the present invention. The signal generating apparatus 100 generates a synthesized signal $F_{vco}$ according to an input signal $S_{base}$, and the signal generating apparatus 100 comprises a phase-locked loop device 102, a detecting device 104, a filtering device 106, and a modulating device 108. Please note that those skilled in this art will readily understand that the signal generating apparatus 100 can be implemented as a fractional N PLL (Phase-locked loop) synthesizer with an adaptive compensation filter, i.e., the filtering device 106. The phase-locked loop device 102 comprises a phase detector 102a, a charge pump circuit 102b, a filter 102c, a voltage controlled oscillator 102d, and a divider 102e. The phase detector 102a is coupled to a reference oscillating signal $F_{ref}$ for generating a detected signal $S_d$ according to the reference oscillating signal $F_{ref}$ and a feedback signal $F_{fb}$. The charge pump circuit 102b coupled to the phase detector 102a for generating a control signal $S_c$ according to the detected signal $S_d$. The filter 102c is coupled to the charge pump circuit 102b for filtering the control signal $S_c$ to generate a reference signal $S_r$. The voltage controlled oscillator 102d is coupled to the filter 102c for generating the synthesized signal $F_{vco}$ according to the control signal $S_c$. The divider 102e is coupled to the voltage controlled oscillator 102d, the modulating device 108, and the phase detector 102a for dividing the synthesized signal $F_{vco}$ according to a dividing factor N and outputting the feedback signal $F_{fb}$ to the phase detector 102a. The detecting device 104 is coupled to the filter 102c for detecting the reference signal $S_r$ to generate a calibrating signal $S_{cab}$. The filtering device 106 is coupled to the detecting device 104 for filtering the input signal $S_{base}$ and calibrating the input signal $S_{base}$ according to the calibrating signal $S_{cab}$ to generate a filtered input signal $S_f$. The modulating device 108 comprises a modulator 108a and a first switch 108b. The modulator 108a is coupled to the filtering device 106 and the divider 102e for modulating the filtered input signal $S_f$ in the normal operation mode and setting the dividing factor according to a first factor setting Ch1 or a second factor setting Ch2 in the calibration mode. The first switch 108b is coupled to the modulator 108a for selectively inputting the first factor selling Ch1 or the second factor setting Ch2 to the modulator 108a. The detecting device 104 comprises a detector 104a, a registering unit 104b, and a computing unit 104c. The detector 104a is coupled to the filter 102c for detecting a first signal $S_{r1}$ and a second signal $S_{r2}$ to generate a first detected data $V_1$ and a second detected data $V_2$, wherein the first signal $S_{r1}$ and the second signal $S_{r2}$ correspond to the first factor selling Ch1 and the second factor setting Ch2 respectively. The registering unit 104b is coupled to the detector 104a for registering the first detected data $V_1$ and the second detected data $V_2$. The computing unit 104c is coupled to the registering unit 104b for processing the first detected data $V_1$ and the second detected data $V_2$ to generate the calibrating signal $S_{cab}$.

Please refer to FIG. 2 again. The detector 104a comprises an analog-to-digital converter (ADC) coupled to the filter 102c for converting the first signal $S_{r1}$ and the second signal $S_{r2}$ into the first detected data $V_1$ and the second detected data $V_2$ respectively. The registering unit 104b comprises a first register 1041, a second register 1042, and a second switch 1043. The first register 1041 registers the first detected data $V_1$; the second register 1042 registers the second detected data $V_2$; and the second switch 1043 is coupled to the first register 1041 and the second register 1042 for selectively coupling an output M2 of the analog-to-digital converter to the first register 1041 or the second register 1042. The computing unit 104c calculates a voltage difference ΔV' between the first detected data $V_1$ and the second detected data $V_2$ to generate the calibrating signal $S_{cab}$. The filtering device 106 comprises a transmit filter 106a and a compensation filter 106b. The transmit filter 106a filters the input signal $S_{base}$ to generate a predetermined signal; the compensation filter 106b is coupled to the transmit filter 106a for receiving the predetermined signal and compensating the predetermined signal according to the calibrating signal $S_{cab}$. Please note that, in this embodiment, the transmit filter 106a and the filtering device 106b are digital filters.

As known by those skilled in this art, the transfer function T(s) of the phase-locked loop device 102 can be shown by the following equation (1):

$$T(s)=(N*K_v*I_{cp}*H(s))/(N*s+K_v*I_{cp}*H(s)), \quad (1)$$

wherein N represents the dividing factor of the divider 102e, Kv represents the sensitivity of the voltage controlled oscillator 102d, Icp is the charge/pump current of the charge pump circuit 102b, and H(s) represents the transfer function of the filter 102c. When the signal generating apparatus 100 is fabricated, the transfer function T(s) of the phase-locked loop device 102 may vary from the predetermined transfer function $T_0(s)$ to become a new transfer function T'(s); said relationships are respectively represented by the following equations (2), (3):

$$T_0(s)=(N*K_{v0}*I_{cp0}*H_0(s))/(N*s+K_{v0}*I_{cp0}*H_0(s)), \quad (2)$$

$$T'(s)=(N*K_v'*I_{cp}'*H'(s))/(N*s+K_v'*I_{cp}'*H'(s)). \quad (3)$$

Please note that, in this embodiment, the present invention is focused on calibrating the sensitivity $K_v$ of the voltage controlled oscillator 102d. In other words, the charge/pump current Icp' of the charge pump circuit 102b and the transfer function H'(s) of the filter 102c are assumed to be calibrated.

According to the embodiment of the present invention, the first switch 108b first couples the first factor setting Ch1 to the modulator 108a in order to set the dividing factor N of the divider 102e to be $N_1$. Then, the detector 104a (i.e., the analog-to-digital converter) detects the first signal $S_{r1}$ at an input node M1 of the voltage controlled oscillator 102d. Please note that, those skilled in this art will readily know that the first signal $S_{r1}$ is an analog voltage at the input node M1, and the analog-to-digital converter converts the analog voltage of the first signal $S_{r1}$ into the digital signal of the first detected data $V_1$. Meanwhile, the second switch 1043 couples to the first register 1041 to register the first detected data $V_1$ into the first register 1041. Then, the first switch 108b couples the second factor setting Ch2 to the modulator 108a for setting the dividing factor N of the divider 102e to be $N_2$. Then, the detector 104a (i.e., the analog-to-digital converter) detects the second signal $S_{r2}$ at the input node M1 of the voltage controlled oscillator 102d. Similarly, the analog-to-digital converter converts the analog voltage of the second signal $S_{r2}$ into the digital signal of the second detected data $V_2$. Meanwhile, the second switch 1043 couples to the second register 1042 to register the second detected data $V_2$ into the second register 1042. Therefore, in order to obtain the sensitivity $K_v'$ of the voltage controlled oscillator 102d of the signal generating apparatus 100 after fabrication, the embodiment of the present invention utilizes the computing unit 104c to generate the voltage difference ΔV' between the first detected data $V_1$ and the second detected data $V_2$ from the registering unit 104b, in which the voltage difference ΔV' corresponds to a predetermined frequency difference Δf of the output of the voltage controlled oscillator 102d. In addition, the following equation (4) represents the predetermined sensitivity $K_{v0}$ of the voltage controlled oscillator 102d:

$$K_{v0}=\Delta f/\Delta V_0, \quad (4)$$

wherein $\Delta V_0$ is the predetermined voltage difference at the input node M1 of the voltage controlled oscillator 102d for generating the predetermined frequency difference Δf. Furthermore, the sensitivity $K_v'$ after fabrication is shown by the following equation (5):

$$K_v'=\Delta f/\Delta V', \quad (5)$$

Furthermore, it can be obtained that:

$$\Delta V'/\Delta V_0 = K_{v0}/K_v', \quad (6)$$

Therefore, the value $\Delta V'/\Delta V_0$ can be utilized as the calibrating signal $S_{cab}$ for the filtering device 106. Please note that, as utilizing the value $K_{v0}/K_v'$ (i.e., $\Delta V'/\Delta V_0$) to calibrate the digital filter within the filtering device 106 is well-known to those skilled in this art, the detailed description is omitted here for brevity.

Figure 3:
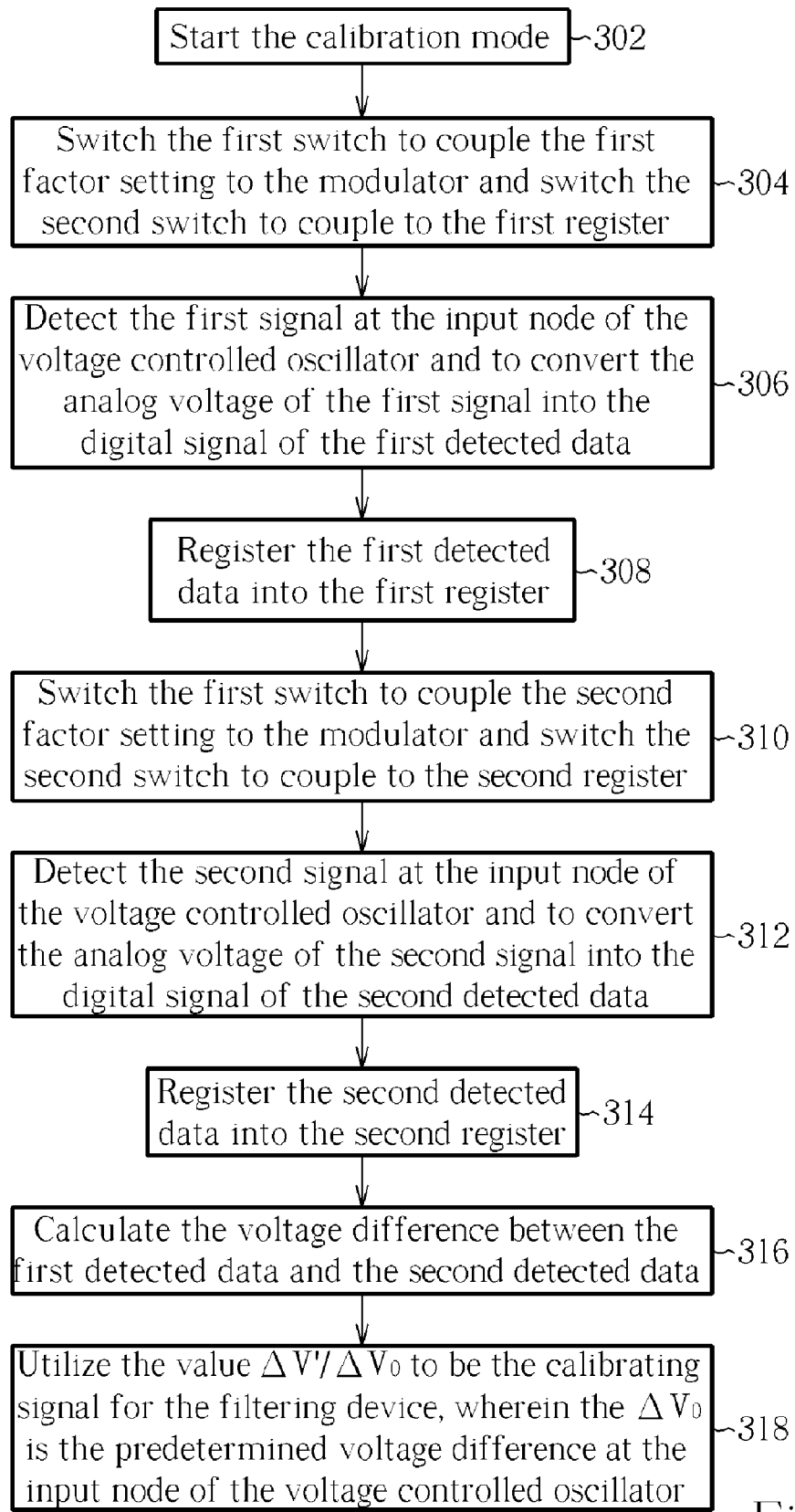
FIG. 3 is a flowchart illustrating a signal generating method employed by the signal generating apparatus as shown in FIG. 2.

Please refer to FIG. 3. FIG. 3 is a flowchart illustrating a signal generating method employed by the signal generating apparatus 100 as shown in FIG. 2. In other words, the signal generating method is described through the fractional N PLL (Phase-locked loop) synthesizer with the adaptive compensation filter, i.e., the filtering device 106. The signal generating method comprises the following steps:

Step 302: Start the calibration mode;

Step 304: Switch the first switch 108b to couple the first factor setting Ch1 to the modulator 108a in order to set the dividing factor N of the divider 102e to be $N_1$, and switch the second switch 1043 to couple to the first register 1041;

Step 306: Detect the first signal $S_{r1}$ at the input node M1 of the voltage controlled oscillator 102d to convert the analog voltage of the first signal $S_{r1}$ into the digital signal of the first detected data $V_1$;

Step 308: Register the first detected data $V_1$ into the first register 1041;

Step 310: Switch the first switch 108b to couple the second factor setting Ch2 to the modulator 108a in order to set the dividing factor N of the divider 102e to be $N_2$, and switch the second switch 1043 to couple to the second register 1042;

Step 312: Detect the second signal $S_{r2}$ at the input node M1 of the voltage controlled oscillator 102d to convert the analog voltage of the second signal $S_{r2}$ into the digital signal of the second detected data $V_2$;

Step 314: Register the second detected data $V_2$ into the second register 1042;

Step 316: Calculate the voltage difference ΔV' between the first detected data $V_1$ and the second detected data $V_2$;

Step 318: Utilize the value $\Delta V'/\Delta V_0$ to be the calibrating signal $S_{cab}$ for the filtering device 106, wherein the $\Delta V_0$ is the predetermined voltage difference at the input node M1 of the voltage controlled oscillator 102d.

Please note that, in step 318, as utilizing the value $K_{v0}/K_v'$ (i.e., $\Delta V'/\Delta V_0$) to calibrate the digital filter within the filtering device 106 is well-known to those skilled in this art, the detailed description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal generating apparatus, for generating a synthesized signal according to an input signal, comprising:

a phase-locked loop device, comprising:
a phase detector, coupled to a reference oscillating signal, for generating a detected signal according to the reference oscillating signal and a feedback signal;
a charge pump circuit, coupled to the phase detector, for generating a control signal according to the detected signal;
a filter, coupled to the charge pump circuit, for filtering the control signal to generate a reference signal;
a voltage controlled oscillator, coupled to the filter, for generating the synthesized signal according to the reference signal; and
a divider, coupled to the voltage controlled oscillator, for dividing the synthesized signal according to a dividing factor for generating the feedback signal;

a detecting device, coupled to the filter, for detecting the reference signal to generate a calibrating signal;

a filtering device, coupled to the detecting device, for filtering the input signal and calibrating the input signal according to the calibrating signal to generate a filtered input signal; and a modulating device, comprising:
a first switch, having a first input node for receiving a first factor setting, a second input node for receiving a second factor setting, and an output node, wherein in the calibration mode, the first switch provides a factor setting at the output node by coupling the output node to the first input node and then coupling the output node to the second input node; and
a modulator, coupled to the filtering device, the first switch, and the divider, for modulating the filtered input signal in the normal operation mode and setting the dividing factor according to the factor setting received from the output node of the first switch in the calibration mode.

2. The signal generating apparatus of claim 1, wherein the detecting device comprises:

a detector, coupled to the filter, for detecting a first signal and a second signal to generate a first detected data and a second detected data, wherein the first signal and the second signal correspond to the first factor selling and the second factor setting respectively;

a registering unit, coupled to the detector, for registering the first detected data and the second detected data; and a computing unit, coupled to the registering unit, for processing the first detected data and the second detected data to generate the calibrating signal.

3. The signal generating apparatus of claim 2, wherein the detector comprises:

an analog-to-digital converter, coupled to the filter, for converting the first signal and the second signal into the first detected data and the second detected data respectively; and the registering unit comprises:
a first register, for registering the first detected data;
a second register, for registering the second detected data; and
a second switch, coupled to the first register and the second register, for selectively coupling an output of the analog-to-digital converter to the first register or the second register;

wherein the computing unit calculates a difference between the first detected data and the second detected data to be the calibrating signal.

4. The signal generating apparatus of claim 3, wherein the filtering device comprises:
- a transmit filter, for filtering the input signal to generate a predetermined band signal;
- a compensation filter, coupled to the transmit filter, for receiving the predetermined band signal and compensating the predetermined band signal according to the calibrating signal.

5. The signal generating apparatus of claim 4, wherein the transmit filter is a pulse shapping filter.

6. The signal generating apparatus of claim 3, wherein the filtering device is a digital filter.

7. The signal generating apparatus of claim 1, wherein the first factor setting and the second factor setting both correspond to a sub-band of the voltage controlled oscillator.

8. A signal generating method, for generating a synthesized signal according to an input signal, comprising:
(a) utilizing a phase-locked loop device to generate the synthesized signal, wherein the phase-locked loop device comprises:
- a phase detector, coupled to a reference oscillating signal, for generating a detected signal according to the reference oscillating signal and a feedback signal;
- a charge pump circuit, coupled to the phase detector, for generating a control signal according to the detected signal;
- a filter, coupled to the charge pump circuit, for filtering the control signal to generate a reference signal;
- a voltage controlled oscillator, coupled to the filter, for generating the synthesized signal according to the reference signal; and
- a divider, coupled to the voltage controlled oscillator, for dividing the synthesized signal according to a dividing factor for generating the feedback signal;

(b) detecting the reference signal to generate a calibrating signal;
(c) filtering the input signal and calibrating the input signal according to the calibrating signal to generate a filtered input signal;
(d-1) modulating the filtered input signal in the normal operation mode and selling the dividing factor according to a factor setting in the calibration mode; and
(d-2) in the calibration mode, selecting a first factor setting as the factor setting used in step (d-1), and then selecting a second factor setting as the factor setting used in step (d-1).

9. The signal generating method of claim 8, wherein the step (b) comprises:
(e) detecting a first signal and a second signal to generate a first detected data and a second detected data, wherein the first signal and the second signal correspond to the first factor setting and the second factor setting respectively;
(f) registering the first detected data and the second detected data; and
(g) processing the first detected data and the second detected data to generate the calibrating signal.

10. The signal generating method of claim 9, wherein the step (e) comprises:
converting the first signal and the second signal into the first detected data and the second detected data respectively; and the step (f) calculates a difference between the first detected data and the second detected data to be the calibrating signal.

11. The signal generating method of claim 10, wherein the step (c) comprises:
filtering the input signal to generate a predetermined band signal;
receiving the predetermined band signal and compensating the predetermined band signal according to the calibrating signal.

12. The signal generating method of claim 8, wherein the first factor setting and the second factor setting both correspond to a sub-band of the voltage controlled oscillator.

13. A signal generating apparatus, for generating a synthesized signal according to an input signal, comprising:
a phase-locked loop device, comprising:
- a phase detector, coupled to a reference oscillating signal, for generating a detected signal according to the reference oscillating signal and a feedback signal;
- a charge pump circuit, coupled to the phase detector, for generating a control signal according to the detected signal;
- a filter, coupled to the charge pump circuit, for filtering the control signal to generate a reference signal;
- a voltage controlled oscillator, coupled to the filter, for generating the synthesized signal according to the reference signal; and
- a divider, coupled to the voltage controlled oscillator, for dividing the synthesized signal according to a dividing factor for generating the feedback signal;

a detecting device, coupled to the filter, for detecting the reference signal to generate a calibrating signal;
a filtering device, coupled to the detecting device, for filtering the input signal and calibrating the input signal according to the calibrating signal to generate a filtered input signal; and
a modulating device, comprising:
- a modulator, coupled to the filtering device and the divider, the modulator being for modulating the filtered input signal in the normal operation mode and setting the dividing factor according to a first factor setting or a second factor setting in the calibration mode; and
- a first switch, coupled to the second input node of the modulator, for selectively inputting the first factor setting or the second factor setting to the modulator instead of the filtering device.

14. A signal generating apparatus, for generating a synthesized signal according to an input signal, comprising:
a phase-locked loop device, comprising:
- a phase detector, coupled to a reference oscillating signal, for generating a detected signal according to the reference oscillating signal and a feedback signal;
- a charge pump circuit, coupled to the phase detector, for generating a control signal according to the detected signal;
- a filter, coupled to the charge pump circuit, for filtering the control signal to generate a reference signal;
- a voltage controlled oscillator, coupled to the filter, for generating the synthesized signal according to the reference signal; and
- a divider, coupled to the voltage controlled oscillator, for dividing the synthesized signal according to a dividing factor for generating the feedback signal;

a detecting device, coupled to the filter, for detecting the reference signal to generate a calibrating signal, the detecting device comprising:

a detector, coupled to the filter, for detecting a first signal and a second signal to generate a first detected data and a second detected data, wherein the first signal and the second signal correspond to a first factor setting and a second factor setting respectively, the detector comprising:
   an analog-to-digital converter, coupled to the filter, for converting the first signal and the second signal into the first detected data and the second detected data respectively;
a registering unit, coupled to the detector, for registering the first detected data and the second detected data, the registering unit comprising:
   a first register, for registering the first detected data;
   a second register, for registering the second detected data; and
   a second switch, coupled to the first register and the second register, for selectively coupling an output of the analog-to-digital converter to the first register or the second register, wherein the computing unit calculates a difference between the first detected data and the second detected data to be the calibrating signal; and
a computing unit, coupled to the registering unit, for processing the first detected data and the second detected data to generate the calibrating signal;
a filtering device, coupled to the detecting device, for filtering the input signal and calibrating the input signal according to the calibrating signal to generate a filtered input signal; and
a modulating device, comprising:
   a modulator, coupled to the filtering device and the divider, for modulating the filtered input signal in the normal operation mode and setting the dividing factor according to the first factor setting or the second factor setting in the calibration mode; and
   a first switch, coupled to the modulator, for selectively inputting the first factor setting or the second factor setting to the modulator.

15. The signal generating apparatus of claim 14, wherein the filtering device comprises:
   a transmit filter, for filtering the input signal to generate a predetermined band signal; and
   a compensation filter, coupled to the transmit filter, for receiving the predetermined band signal and compensating the predetermined band signal according to the calibrating signal.

16. The signal generating apparatus of claim 15, wherein the transmit filter is a pulse shapping filter.

17. The signal generating apparatus of claim 14, wherein the filtering device is a digital filter.

18. A signal generating method, for generating a synthesized signal according to an input signal, comprising:
   (a) utilizing a phase-locked loop device to generate the synthesized signal, wherein the phase-locked loop device comprises:
      a phase detector, coupled to a reference oscillating signal, for generating a detected signal according to the reference oscillating signal and a feedback signal;
      a charge pump circuit, coupled to the phase detector, for generating a control signal according to the detected signal;
      a filter, coupled to the charge pump circuit, for filtering the control signal to generate a reference signal;
      a voltage controlled oscillator, coupled to the filter, for generating the synthesized signal according to the reference signal; and
      a divider, coupled to the voltage controlled oscillator, for dividing the synthesized signal according to a dividing factor for generating the feedback signal;
   (b) detecting the reference signal to generate a calibrating signal, comprising:
      (b-1) detecting a first signal and a second signal for generating a first detected data and a second detected data, wherein the first signal and the second signal correspond to a first factor setting and a second factor setting respectively, comprising:
         converting the first signal and the second signal into the first detected data and the second detected data respectively;
      (b-2) registering the first detected data and the second detected data, and calculating a difference between the first detected data and the second detected data to be the calibrating signal; and
      (b-3) processing the first detected data and the second detected data to generate the calibrating signal;
   (c) filtering the input signal and calibrating the input signal according to the calibrating signal to generate a filtered input signal; and
   (d) modulating the filtered input signal in the normal operation mode and setting the dividing factor according to the first factor setting or the second factor setting in the calibration mode.

19. The signal generating method of claim 18, wherein the step (c) comprises:
   filtering the input signal to generate a predetermined band signal; and
   receiving the predetermined band signal and compensating the predetermined band signal according to the calibrating signal.

* * * * *